(12) United States Patent
Chisholm et al.

(10) Patent No.: US 7,577,536 B1
(45) Date of Patent: Aug. 18, 2009

(54) DETERMINATION OF OHMIC LOSSES IN ELECTRICAL DEVICES

(75) Inventors: Calum Chisholm, Pasadena, CA (US); Dane Boysen, Pasadena, CA (US); Matt Hetterman, Altadena, CA (US); Alex Papandrew, Pasadena, CA (US)

(73) Assignee: Superprotonic, Inc., Pasadena, CA (US)

( * ) Notice: Subject to any disclaimer, the term of this patent is extended or adjusted under 35 U.S.C. 154(b) by 129 days.

(21) Appl. No.: 11/760,555

(22) Filed: Jun. 8, 2007

(51) Int. Cl.
*G06F 19/00* (2006.01)
*G01R 19/00* (2006.01)

(52) U.S. Cl. ......................... 702/65; 702/64
(58) Field of Classification Search ............. 702/64, 702/65; 323/310, 313; 320/21, 23

See application file for complete search history.

(56) References Cited

U.S. PATENT DOCUMENTS

| 5,341,004 A * | 8/1994 | Furuhata ............... 257/139 |
| 5,396,163 A * | 3/1995 | Nor et al. ............. 320/159 |
| 2008/0096075 A1 * | 4/2008 | Lundblad et al. ....... 429/30 |

* cited by examiner

*Primary Examiner*—Bryan Bui
(74) *Attorney, Agent, or Firm*—Townsend and Townsend and Crew LLP

(57) ABSTRACT

The present invention provides a method for determining voltage loss in an electrical device. The method includes the steps of obtaining an array A of voltage values corresponding to at least one current interrupt measurement at current $I_n$, wherein $I_n$ corresponds to current values $I_1, I_2, \ldots, I_n$, wherein subscript n is at least 3; forming an array D of difference values using a difference of the array A over an elapsed time; processing the difference values of the array D to obtain $V_n$; determining $V_n$ for each $I_n$ to form an array V of $V_n$; and calculating a resistance, R, using the array V, thereby determining voltage loss in the electrical device.

18 Claims, 7 Drawing Sheets

DETERMINATION OF OHMIC LOSSES IN ELECTRICAL DEVICES

BACKGROUND OF THE INVENTION

Many techniques exist for measuring resistance in a fuel cell, such as the current interrupt method, the AC resistance method, the high frequency resistance (HFR) method and the electrochemical impedance spectroscopy (EIS) method. The objective of each method is to determine the resistance of the fuel cell.

The current interrupt method is a time-domain AC technique requiring a quick interrupt of the fuel cell current and measuring the terminal voltage before and after the interruption. The AC resistance method requires the application of a fixed, single high frequency wave (sine) to the fuel cell in order to measure the total impedance magnitude of the fuel cell. In the HFR method, the electrolyte resistance is determined using the real component of the impedance measured at high frequency. The EIS technique is similar to the HFR method, but involves applying the AC perturbation over a broad range of frequencies and monitoring the variations in magnitude and phase of the voltage and current.

While there are several methods available for measuring resistance in a fuel cell, there exists a need for improved methods of measuring resistance in a fuel cell. Surprisingly, the present invention meets this and other needs.

BRIEF SUMMARY OF THE INVENTION

In one embodiment, the present invention provides a method for determining voltage loss in an electrical device. The method comprises obtaining an array A of voltage values corresponding to at least one current interrupt measurement at current $I_n$, wherein $I_n$ corresponds to current values $I_1$, $I_2$, ..., $I_n$, wherein subscript n is at least 3. The method also comprises forming an array D of difference values using a difference of said array A over an elapsed time. The method also comprises processing the difference values of the array D to obtain $V_n$. The method also comprises determining $V_n$ for each $I_n$ to form an array V of $V_n$. The method also comprises calculating a resistance, R, using the array V, thereby determining voltage loss in the electrical device.

In some embodiments, the difference values of the array D are formed according to the formula: $D(j)=A(j)-A(j-1)$, wherein j is an index for the elapsed time.

In some other embodiments, the processing comprises the additional step of computing the standard deviation of the difference values of the array D. Additional processing steps include identifying each index, j', of the array D having a difference value greater than 8 standard deviations from the median of the distribution of the difference values of the array D. Additional processing steps include determining a range of indices, j*, consisting of the largest contiguous band of indices j' in the array D. Additional processing steps include forming a difference between the arithmetic mean of the voltage values under the current $I_n$ and the maximum voltage value of array A in the index range j*.

In some further embodiments, the calculating comprises performing a linear least-squares fit of $V_n$ versus $I_n$.

In another embodiment, the present invention further comprises adjusting a polarization curve for ohmic losses using the resistance R by forming a sum of each measured voltage, $V_m$, and the product of each measured current, $I_m$, and the resistance, R.

In a further embodiment, the present invention provides a method for determining voltage loss in an electrical device. The method comprises obtaining an array A of voltage values corresponding a current interrupt measurement at current $I_n$, wherein $I_n$ corresponds to current values $I_1$, ..., $I_n$, wherein subscript n is at least 3. The method also comprises forming an array D of difference values using a difference of said array A over an elapsed time, wherein the difference values of the array D are formed according to the formula: $D(j)=A(j)-A(j-1)$, wherein j is an index for the elapsed time. The method also comprises computing the standard deviation of the difference values of the array D. The method also comprises identifying each index, j', of the array D having a difference value greater than 8 standard deviations from the median of the distribution of the difference values of the array D. The method also comprises determining a range of indices, j*, consisting of the largest contiguous band of indices j' in the array D. The method also comprises forming a difference between the arithmetic mean of the voltage values under the current $I_n$ and the maximum voltage value of array A in the index range j*, to obtain $V_n$. The method also comprises determining $V_n$ for each $I_n$ to form an array V of $V_n$. The method also comprises calculating a resistance, R, by performing a linear least-squares fit of $V_n$ versus $I_n$, thereby determining the voltage loss in the electrical device.

In another embodiment, the present invention provides a device for determining voltage loss in an electrical device. The device comprises input means for receiving voltage values. The device also comprises a processor configured to determine voltage losses in an electrical device, performing instructions such as the obtaining, forming, processing, determining and calculating described above. The device also comprises output means generating a signal.

In some embodiments, the input means is selected from the group consisting of a coaxial cable and an ethernet cable. In other embodiments, the difference values are formed according to the formula above. In still other embodiments, the processing step comprises the computing, identifying, determining and forming steps described above. In another embodiment, the calculating step comprises performing the linear-least squares fit described above. In some other embodiments, the output means is selected from the group consisting of a computer, a printer, a signal and a screen.

In some other embodiments, the processor of the device adjusts a polarization curve for ohmic losses by the means described above.

In a further embodiment, the present invention provides a computer program product stored on a computer readable medium for causing a computer to determine voltage loss in an electrical device. The computer program performs instructions to execute the obtaining, forming, processing, determining and calculating steps described above.

In some embodiments, the difference values are formed according the formula above. In still other embodiments, the processing step further comprises the computing, identifying, determining and forming steps described above. In another embodiment, the calculating step further comprises performing the linear-least squares fit described above.

In some other embodiments, the computer program product performs instructions to adjust a polarization curve for ohmic losses by the means described above.

DETAILED DESCRIPTION OF THE INVENTION

The present invention provides a method for determining voltage loss in an electrical device. Examples of electrical devices useful in the present invention includes, but are not limited to, electrochemical devices, photovoltaic devices and thermoelectric devices. Electrochemical devices useful in the present invention include, but are not limited to, batteries and fuel cells.

Figure 1:
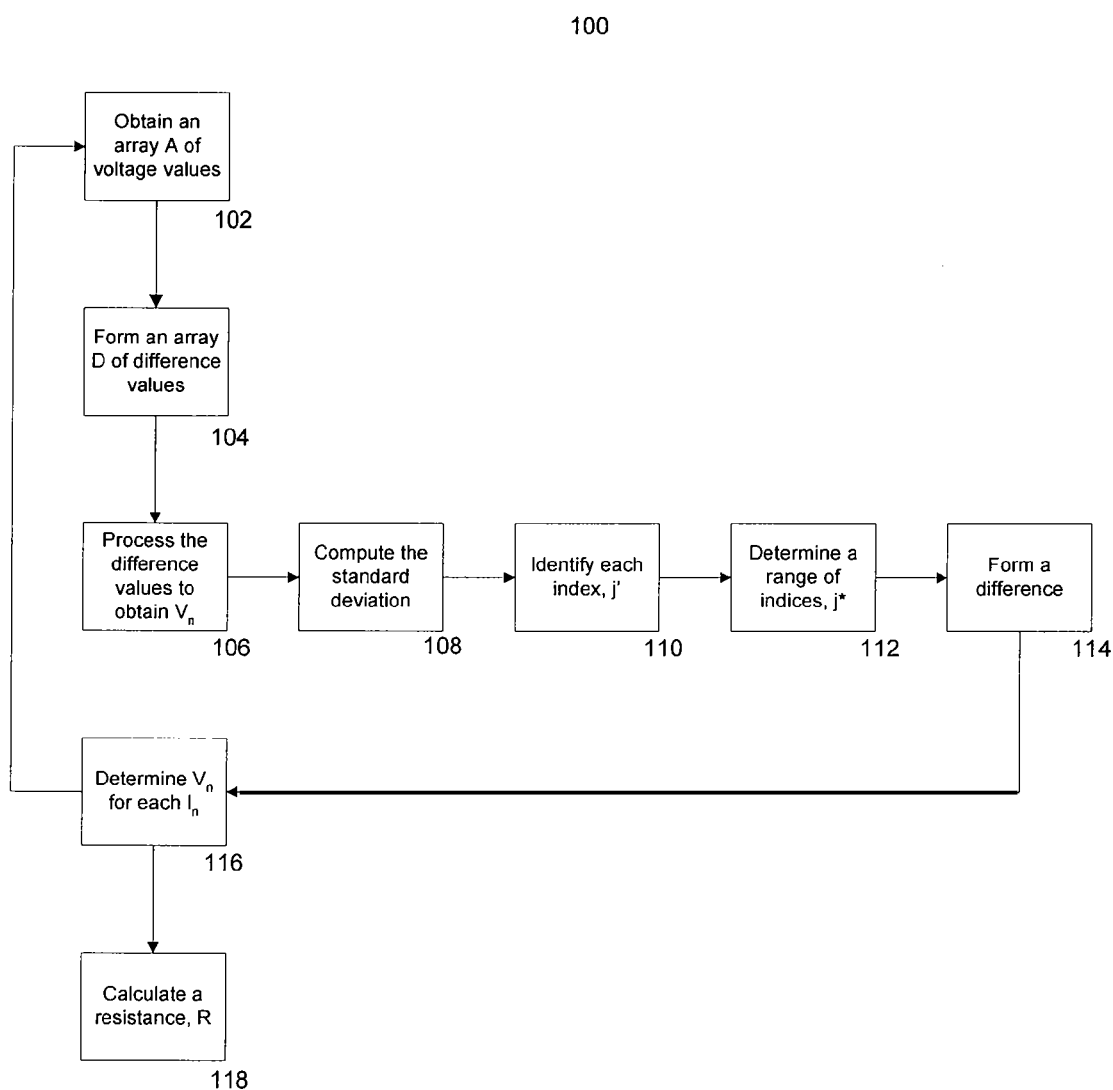
FIG. 1 is a flowchart of the method in accordance with one embodiment of the present invention.

FIG. 1 is a flowchart of the method in accordance with one embodiment of the present invention. The first step of the method of the present invention is to obtain an array A of voltage values (102). The voltage values obtained correspond to at least one current interrupt measurement at current $I_n$. Current $I_n$ corresponds to a plurality of current values $I_1$, $I_2$, ..., $I_n$, wherein subscript n is at least 3.

Figure 4:
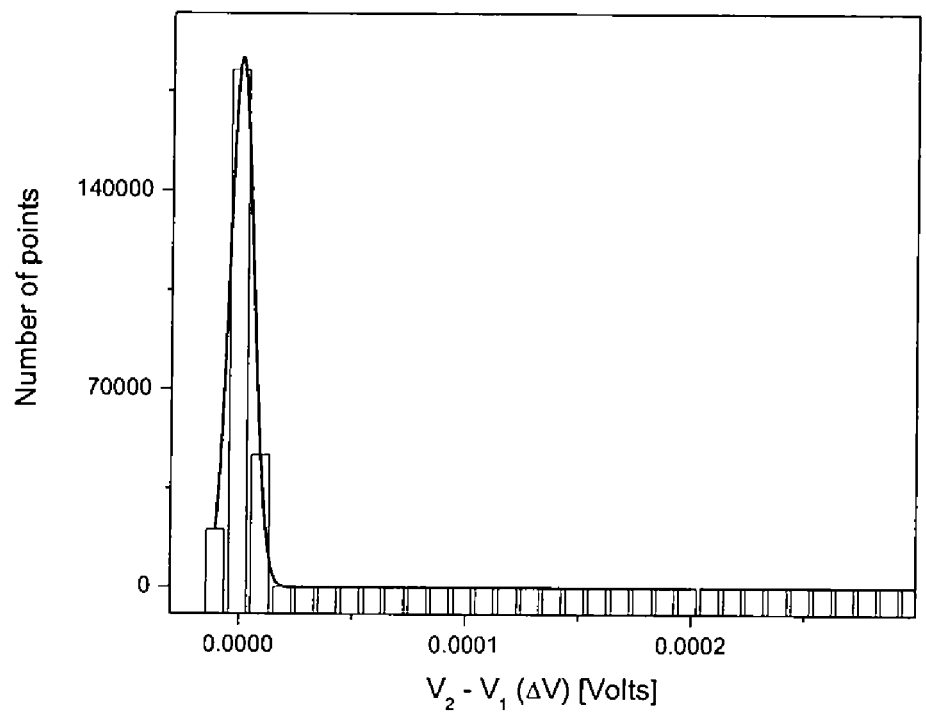
FIG. 4. shows a sample histogram of the values of array D, along with a Gaussian fit of the distribution.

An array D of difference values is formed using the voltage values of array A (104). The difference values of array D are calculated according to the formula: $D(j)=A(j)-A(j-1)$, wherein j is an index for the elapsed time. An exemplary histogram obtained in this manner is shown in FIG. 4.

Figure 5:
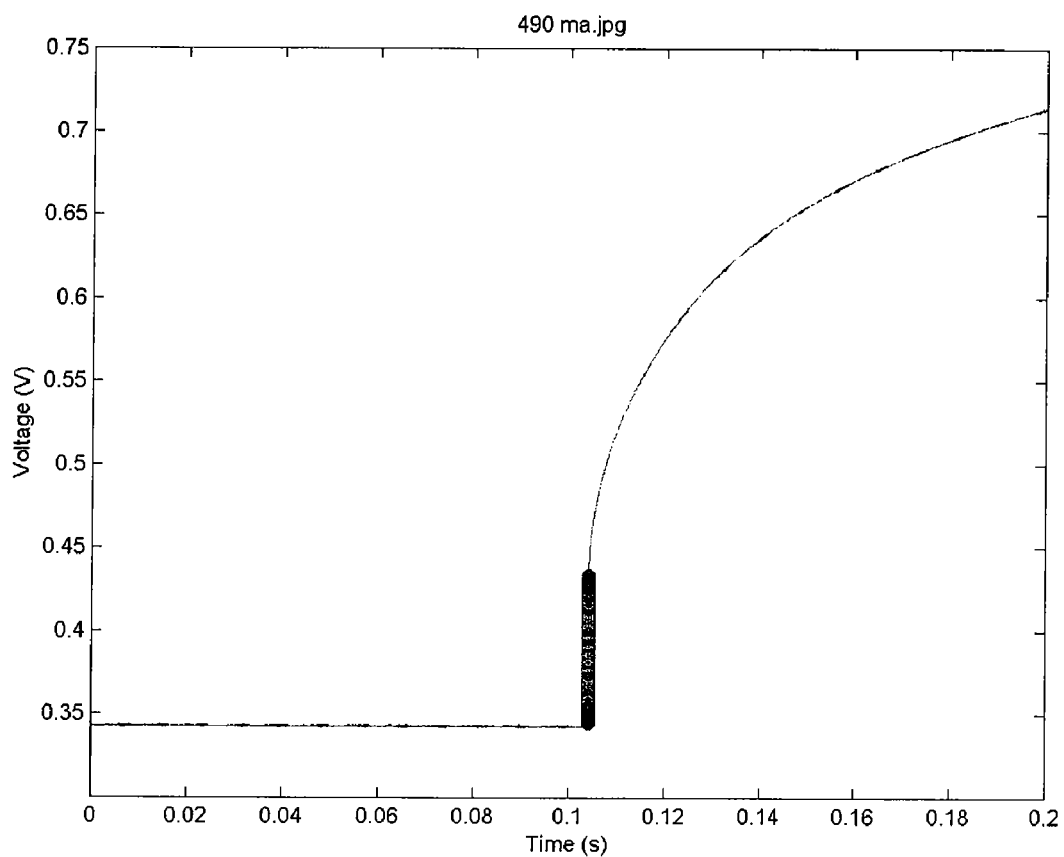
FIG. 5 is an example of the ohmic voltage drop, $V_n$, for current $I_n$.

The voltage values of array D is processed in order to obtain $V_n$ (106). The processing of the voltage values involves computing the standard deviation of the difference values of array D (108). A distribution of the difference values of array D is calculated along with a mean of the distribution. The index, j', of each difference value greater than 8 standard deviations from the median of the distribution is identified (110). An index range, j*, having the largest contiguous band of indices, j', is then determined (112). The arithmetic mean of the voltage values under the current $I_n$ is calculated, and the difference between the arithmetic mean and the maximum voltage value of array A in the index range j* is calculated to obtain $V_n$ (114). An exemplary graph of voltage values versus time is shown in FIG. 5.

Figure 6:
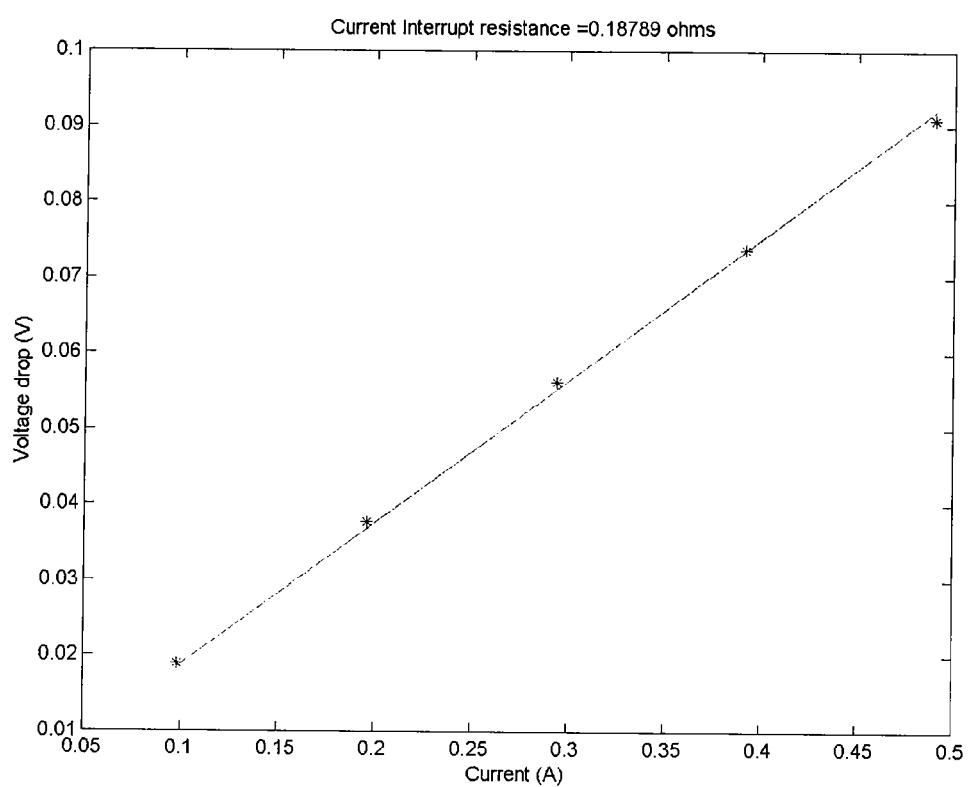
FIG. 6 is an exemplary graph of a linear least-squares fit to find the resistance R.

Box 116 represents the step of forming an array V of $V_n$. Array V is formed by repeating the steps of obtaining an array A of voltage values (102) to forming a difference (114), to determine $V_n$ for each $I_n$. When $V_n$ has been determined for each $I_n$, the resistance, R, is then calculated (118). The resistance, R, is calculated using the values of array V by performing a linear least-squares fit of $V_n$ versus $I_n$. An exemplary linear least-squares fit of $V_n$ versus $I_n$ is shown in FIG. 6.

Figure 7:
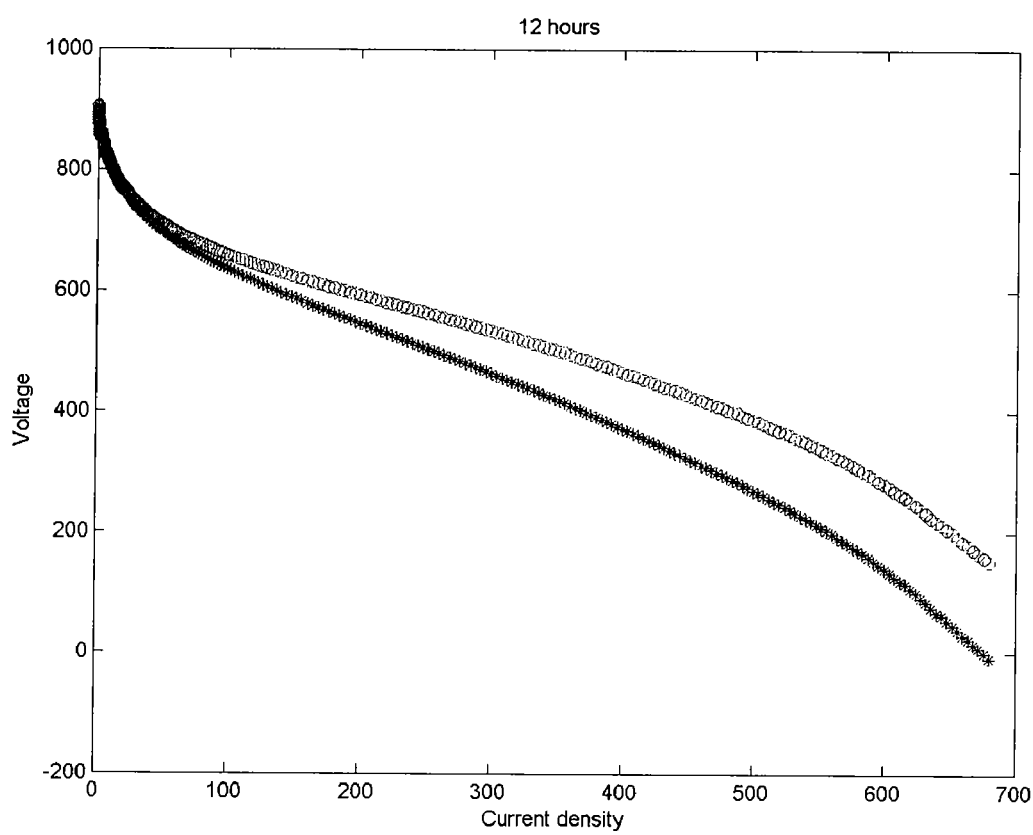
FIG. 7 is a graph of a corrected polarization curve obtained in accordance with one embodiment of the present invention.

When the electrical device is an electrochemical device such as a fuel cell, the polarization curve for ohmic losses can be adjusted using the calculated resistance R. The adjustment for ohmic losses is performed according to the following equation:

$$V_{adjusted}=R \times I_m + V_m$$

where a product of each measured current, $I_m$, and the resistance, R, is first formed, followed by forming a sum of the product and each measured voltage, $V_m$. An exemplary graph showing the corrected voltage curve is shown in FIG. 7.

Figure 2:
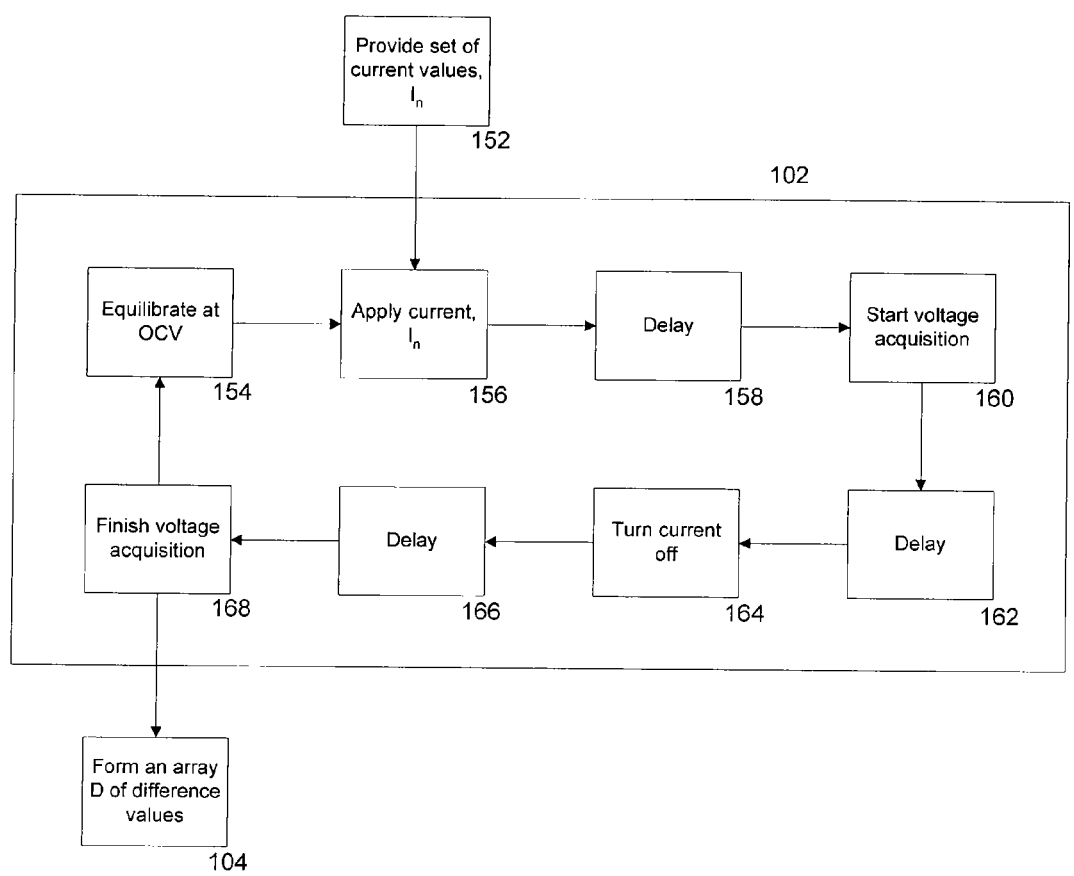
FIG. 2 is a flowchart of the acquisition of an array A of voltage values at current $I_n$.

The array A of voltage values of 102 is obtained according to the flowchart in FIG. 2. A set of current values, $I_n$, is provided in 152. The set of current values $I_n$ contains at least three current values. Following an equilibration at OCV (154), current $I_n$ is applied (156). The equilibration time can be several seconds or a few minutes, e.g., 10 seconds. There is then a delay (158) followed by the start of voltage acquisition (160). After another delay (162), the current is turned off (164). After a further delay (166), the voltage acquisition is completed (168), thus obtaining an array A of voltage values at $I_n$ (102). An array A of difference values (104) is then formed as described above.

The steps of equilibrating (154) to finishing the voltage acquisition (168) can then be repeated using another current value $I_n$ to obtain another array A of voltage values.

The delay times for 158, 162 and 166 can be less than a minute, e.g., 200 ms.

Figure 3:
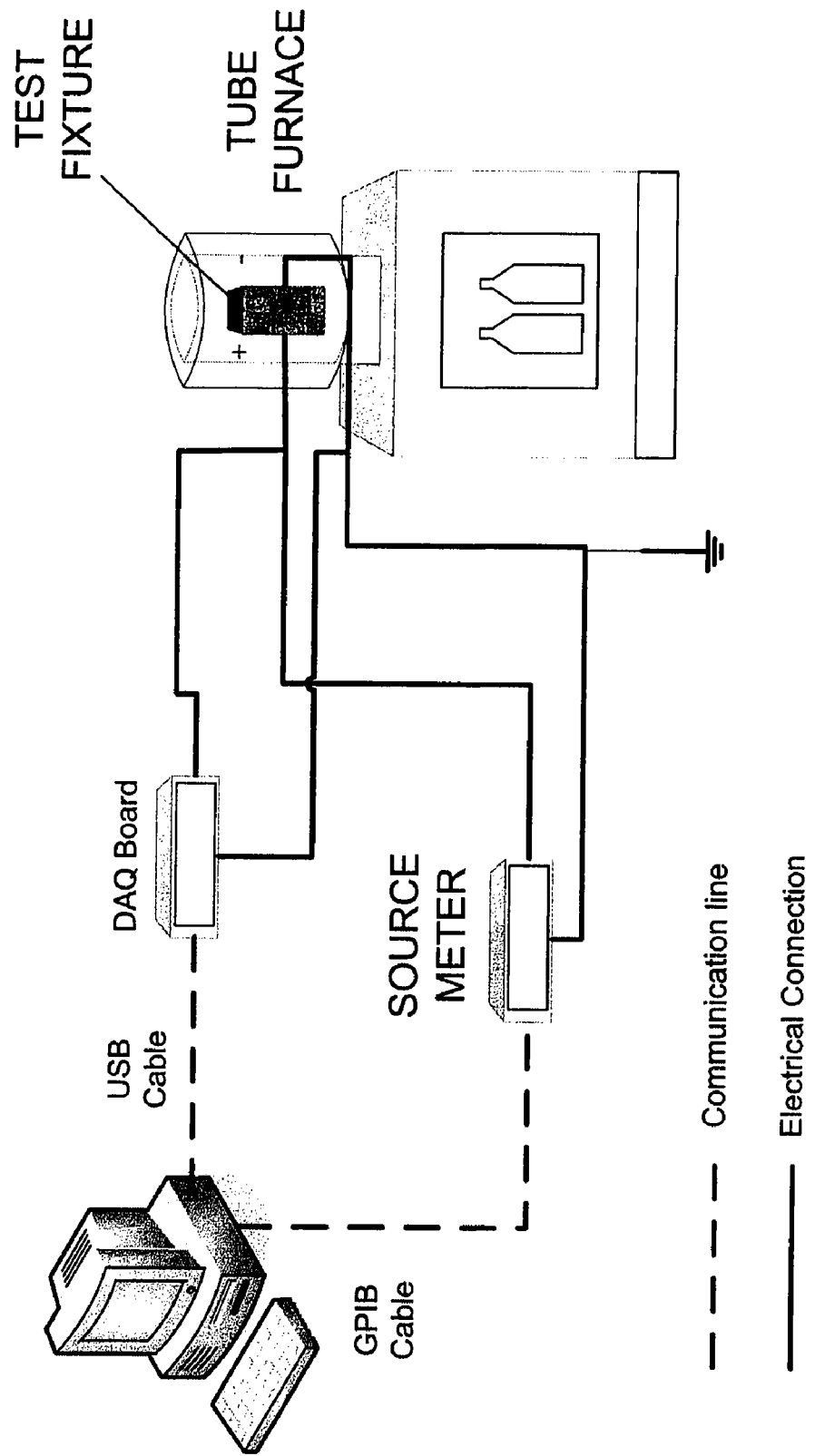
FIG. 3 is one exemplary schematic diagram of the device in accordance with one embodiment of the instant invention.

The methods of the present invention can be performed by a device having input means, output means, and a processor configured to determine the voltage losses in an electrical device. One such device is shown in FIG. 3. For example, the device (306) can be placed in a tube furnace (308) connected to an oven containing water bubblers (310). The computer (302) provides the current settings and provides instructions to the DAQ board (304). Source meter 312 provides DAQ board 304 with voltage and current measurements. DAQ board 302 also measures the voltage and current, and transmits that information to computer 302.

The processor of the device of the present invention performs several instructions, including obtaining an array A of voltage values corresponding to at least one current interrupt measurement at current $I_n$, wherein $I_n$ corresponds to current values $I_1$, ..., $I_n$, wherein subscript n is at least 3. Additional instructions include forming an array D of difference values using a difference of said array A over an elapsed time. Still further instructions include processing the voltage values of the array D to obtain $V_n$, determining $V_n$ for each $I_n$ to form an array V of $V_n$ and calculating a resistance, R, using the array V.

The input means of the device include, but are not limited to, a coaxial cable, an ethernet cable, and the like.

Output means for the device include any type of display device such as a computer, a printer, a signal or a screen.

The processor of the device of the present invention can perform additional instructions such as calculating the difference values, additional steps for processing voltage values, calculating a resistance R and adjusting the polarization curve, among others. These steps are described above for the method of determining voltage loss in an electrical device.

The methods of the present invention can be performed by a computer program product stored on a computer readable medium rendered by a computer such as computer 302 in FIG. 3. The computer program causes a computer to determine voltage loss in an electrical device. The computer program performs several instructions including obtaining an array A of voltage values corresponding to at least one current interrupt measurement at current $I_n$, wherein $I_n$ corresponds to current values $I_1$, ..., $I_n$, wherein subscript n is at least 3. Additional instructions include forming an array D of difference values using a difference of said array A over an elapsed time. Still further instructions include processing the voltage values of the array D to obtain $V_n$, determining $V_n$ for each $I_n$ to form an array V of $V_n$ and calculating a resistance, R, using the array V.

The computer program of the present invention can perform additional instructions such as calculating the difference values, additional steps for processing voltage values, calculating a resistance R and adjusting the polarization curve, among others. These steps are described above for the method of determining voltage loss in an electrical device.

Although the foregoing invention has been described in some detail by way of illustration and example for purposes of clarity of understanding, one of skill in the art will appreciate that certain changes and modifications may be practiced within the scope of the appended claims. In addition, each reference provided herein is incorporated by reference in its entirety to the same extent as if each reference was individually incorporated by reference.

What is claimed is:

1. A method for determining voltage loss in an electrical device, the method comprising:

obtaining an array A of voltage values corresponding to at least one current interrupt measurement at current $I_n$, wherein $I_n$ corresponds to current values $I_1, I_2, \ldots, I_n$, wherein subscript n is at least 3;

forming an array D of difference values using a difference of said array A over an elapsed time;

processing the difference values of the array D to obtain $V_n$, by a processing unit;

determining $V_n$ for each $I_n$ to form an array V of $V_n$; and calculating a resistance, R, using the array V, thereby determining voltage loss in the electrical device.

2. The method of claim 1, wherein the difference values of the array D are formed according to the formula: $D(j)=A(j)-A(j-1)$, wherein j is an index for the elapsed time.

3. The method of claim 2, wherein the processing comprises:

computing the standard deviation of the difference values of the array D;

identifying each index, j', of the array D having a difference value greater than 8 standard deviations from the median of the distribution of the difference values of the array D;

determining a range of indices, j*, consisting of the largest contiguous band of indices j' in the array D; and forming a difference between the arithmetic mean of the voltage values under the current $I_n$ and the maximum voltage value of array A in the index range j*.

4. The method of claim 1, wherein the calculating comprises performing a linear least-squares fit of $V_n$ versus $I_n$.

5. The method of claim 1, further comprising:

adjusting a polarization curve for ohmic losses using the resistance R by forming a sum of each measured voltage, $V_m$, and the product of each measured current, $I_m$, and the resistance, R.

6. A method for determining voltage loss in an electrical device, the method comprising:

obtaining an array A of voltage values corresponding a current interrupt measurement at current $I_n$, wherein $I_n$ corresponds to current values $I_1, \ldots, I_n$, wherein subscript n is at least 3;

forming an array D of difference values using a difference of said array A over an elapsed time, wherein the difference values of the array D are formed according to the formula: $D(j)=A(j)-A(j-1)$, wherein j is an index for the elapsed time;

computing the standard deviation of the difference values of the array D, by a processing unit;

identifying each index, j', of the array D having a difference value greater than 8 standard deviations from the median of the distribution of the difference values of the array D;

determining a range of indices, j*, consisting of the largest contiguous band of indices j' in the array D;

forming a difference between the arithmetic mean of the voltage values under the current $I_n$, and the maximum voltage value of array A in the index range j*, to obtain $V_n$;

determining $V_n$ for each $I_n$ to form an array V of $V_n$; and calculating a resistance, R, by performing a linear least-squares fit of $V_n$ versus $I_n$, thereby determining the voltage loss in the electrical device.

7. A device for determining voltage loss in an electrical device, comprising:

input means for receiving voltage values;

a processor configured to determine voltage losses in an electrical device, performing instructions comprising:

obtaining an array A of voltage values corresponding to at least one current interrupt measurement at current $I_n$, wherein $I_n$ corresponds to current values $I_1, \ldots, I_n$, wherein subscript n is at least 3;

forming an array D of difference values using a difference of said array A over an elapsed time;

processing the voltage values of the array D to obtain $V_n$;

determining $V_n$ for each $I_n$ to form an array V of $V_n$;

calculating a resistance, R, using the array V; and output means generating a signal.

8. The device of claim 7, wherein the input means is selected from the group consisting of a coaxial cable and an ethernet cable.

9. The device of claim 7, wherein the difference values of the array D are formed according to the formula: $D(j)=A(j)-A(j-1)$, wherein j is an index for the elapsed time.

10. The device of claim 9, wherein the processing comprises:

computing the standard deviation of the difference values of the array D;

identifying each index, j', of the array D having a difference value greater than 8 standard deviations from the median of the distribution of the difference values of the array D;

determining a range of indices, j*, consisting of the largest contiguous band of indices j' in the array D; and forming a difference between the arithmetic mean of the voltage values under the current $I_n$ and the maximum voltage value of array A in the index range j*.

11. The device of claim 7, wherein the calculating comprises performing a linear least-squares fit of $V_n$ versus $I_n$.

12. The device of claim 7, further comprising:

adjusting a polarization curve for ohmic losses using the resistance R by forming a sum of each measured voltage, $V_m$, and the product of each measured current, $I_m$, and the resistance, R.

13. The device of claim 7, wherein the output means is selected from the group consisting of a computer, a printer, a signal and a screen.

14. A computer program product stored on a computer readable medium, when executed by a processor, for causing a computer to determine voltage loss in an electrical device, performing instructions comprising obtaining an array A of voltage values corresponding to at least one current interrupt measurement at current $I_n$, wherein $I_n$ corresponds to current values $I_1, \ldots, I_n$, wherein subscript n is at least 3;

forming an array D of difference values using a difference of said array A over an elapsed time;

processing the voltage values of the array D to obtain $V_n$;

determining $V_n$ for each $I_n$ to form an array V of $V_n$; and calculating a resistance, R, using the array V.

15. The computer program of claim 14, wherein the difference values of the array D are formed according to the formula: $D(j)=A(j)-A(j-1)$, wherein j is an index for the elapsed time.

16. The computer program of claim 15, wherein the processing comprises:
computing the standard deviation of the difference values of the array D;
identifying each index, j', of the array D having a difference value greater than 8 standard deviations from the median of the distribution of the difference values of the array D;
determining a range of indices, j*, consisting of the largest contiguous band of indices j' in the array D; and
forming a difference between the arithmetic mean of the voltage values under the current $I_n$ and the maximum voltage value of array A in the index range j*.

17. The computer program of claim 14, wherein the calculating comprises performing a linear least-squares fit of $V_n$ versus $I_n$.

18. The computer program of claim 14, further comprising:
adjusting a polarization curve for ohmic losses using the resistance R by forming a sum of each measured voltage, $V_m$, and the product of each measured current, $I_m$, and the resistance, R.

* * * * *